United States Patent
Zahm et al.

(10) Patent No.: US 7,457,598 B2
(45) Date of Patent: Nov. 25, 2008

(54) SIGNAL AMPLIFIER SYSTEM FOR A BROADCAST RECEIVER

(75) Inventors: Michael Zahm, Waldbronn (DE); Stefan Köhler, Keltern (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 423 days.

(21) Appl. No.: 11/020,430

(22) Filed: Dec. 21, 2004

(65) Prior Publication Data

US 2005/0227656 A1 Oct. 13, 2005

(30) Foreign Application Priority Data

Apr. 1, 2004 (DE) .................. 20 2004 005 208 U

(51) Int. Cl.
*H04B 1/06* (2006.01)
*H04B 7/00* (2006.01)
(52) U.S. Cl. .............. 455/245.1; 455/247.1; 455/250.1; 455/251.1; 330/129; 330/136; 330/140
(58) Field of Classification Search .............. 455/67.11, 455/67.13, 67.14, 70, 245.1, 234.1, 134, 455/136, 137, 138, 169.1, 247.1, 250.1, 251.1; 330/129, 136, 140, 279
See application file for complete search history.

(56) References Cited

U.S. PATENT DOCUMENTS

| | | | | |
|---|---|---|---|---|
| 5,528,264 A * | 6/1996 | Kautzer et al. | ............ | 345/158 |
| 5,745,847 A * | 4/1998 | Matsuo | .............. | 455/234.1 |
| 5,943,612 A * | 8/1999 | Dick | .............. | 455/241.1 |
| 6,356,745 B1 * | 3/2002 | Lee et al. | .............. | 455/232.1 |
| 6,420,934 B1 * | 7/2002 | Butler et al. | .............. | 330/279 |
| 6,798,286 B2 * | 9/2004 | Dauphinee et al. | .............. | 330/129 |
| 7,069,051 B1 * | 6/2006 | Katz | .............. | 455/562.1 |
| 2003/0099287 A1 * | 5/2003 | Arambepola | .............. | 375/227 |
| 2003/0202496 A1 * | 10/2003 | Kluge et al. | .............. | 370/338 |
| 2004/0087294 A1 * | 5/2004 | Wang | .............. | 455/276.1 |
| 2004/0179118 A1 * | 9/2004 | Itani | .............. | 348/255 |

* cited by examiner

*Primary Examiner*—Tuan A Pham
(74) *Attorney, Agent, or Firm*—Brinks Hofer Gilson & Lione

(57) ABSTRACT

A signal amplifier system is provided for a mobile or portable broadcast receiver. The signal amplifier system includes an operational circuitry, a signal generator and a voltage supply. The signal generator receives a field strength signal that indicates a field strength of at least one broadcast signal. The signal generator outputs a supply voltage control signal based on the field strength signal. The voltage supply provides one of a first supply voltage and a second supply voltage to the operational circuitry in accordance with the supply voltage control signal.

39 Claims, 11 Drawing Sheets

SIGNAL AMPLIFIER SYSTEM FOR A BROADCAST RECEIVER

BACKGROUND OF THE INVENTION

PRIORITY CLAIM

This application claims the benefit of German Patent Application No. 20 2004 005208.3, filed Apr. 1, 2004. The disclosure of the above application is incorporated herein by reference.

1. Technical Field

The invention relates to signal amplifiers and related system using broadcast receivers.

2. Related Art

Broadcast receivers, such as video and sound receivers, receive broadcast signals from television broadcast stations, radio broadcast stations, and the like. The broadcast receivers may be stationary or mobile. Mobile broadcast receivers may be used in portable devices, such as hand held devices, and may be installed in vehicles, such as trains, automotive vehicles, boats, bicycles, and other fixed or mobile installations.

The broadcast stations may transmit broadcast signals to the receivers over broad geographic areas. Field strengths of the transmitted broadcast signals may vary greatly as the broadcast signals propagate from the station. The broadcast signals may attenuate, may fade and may interfere with other signals as they travel long distances. For instance, the mobile broadcast receiver may experience high field strength as it approaches the station and lower field strengths as it moves away. When the broadcast receiver is near the station, the quality of the received signals may also be affected by intermodulation distortions.

To try to compensate for the varied field strength, mobile broadcast receivers may utilize amplifiers, such as variable gain amplifiers positioned at an input of the broadcast receivers. An amplifying circuit also may be used to try to compensate for distortions in the signals. The amplifying circuit may consume electrical power provided by a limited power supply, such as a battery, of the portable device. To help compensate for limited power supplies, the amplifying circuitry may be replaced by devices that theoretically have an unlimited supply power. However, such devices often emit large amounts of heat. The heat may be especially problematic when placed in confined spaces. For instance, a radio receiver or a television receiver may be built into a spacially restricted area, such as a head unit of an automobile, and may therefore require very limited heat dissipation. Dissipated heat also may adversely affect heat sensitive electronic components located near the broadcast receiver.

SUMMARY

This invention provides a signal amplifier system for a mobile or portable broadcast receiver. The signal amplifier system may include operational circuitry, a signal generator and a voltage supply. The signal generator receives a field strength signal that indicates a field strength of at least one broadcast signal. The signal generator outputs a supply voltage control signal based on the field strength signal. The voltage supply provides one of a first supply voltage and a second supply voltage to the operational circuitry in accordance with the supply voltage control signal.

This invention further provides a method for controlling a supply voltage to a signal amplifier system for a broadcast receiver. The method may include (i) receiving a field strength signal, (ii) comparing the field strength signal with a plurality of threshold values, (iii) generating a supply voltage control signal based on a comparing result and (iv) adjusting a supply voltage in accordance with the supply voltage control signal. The field strength signal indicates a field strength of at least one broadcast signal. The method may further include supplying the supply voltage to an operational circuitry.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

An amplifying system is described for a broadcast receiver. The system may provide power savings and corresponding reduced heat dissipation may be obtained without reducing the quality with which broadcast signals are received. A supply voltage control signal may be generated based on a field strength of the received broadcast signal. Either a first or a second supply voltage may be applied to an operational circuitry of the amplifying system in accordance with the supply voltage control signal. This may allow the amplifier to reduce the supply voltage when the received field strength is moderate, but still allow the amplifier to apply a sufficiently high supply voltage when the field strength of the received signal is strong.

Figure 1:
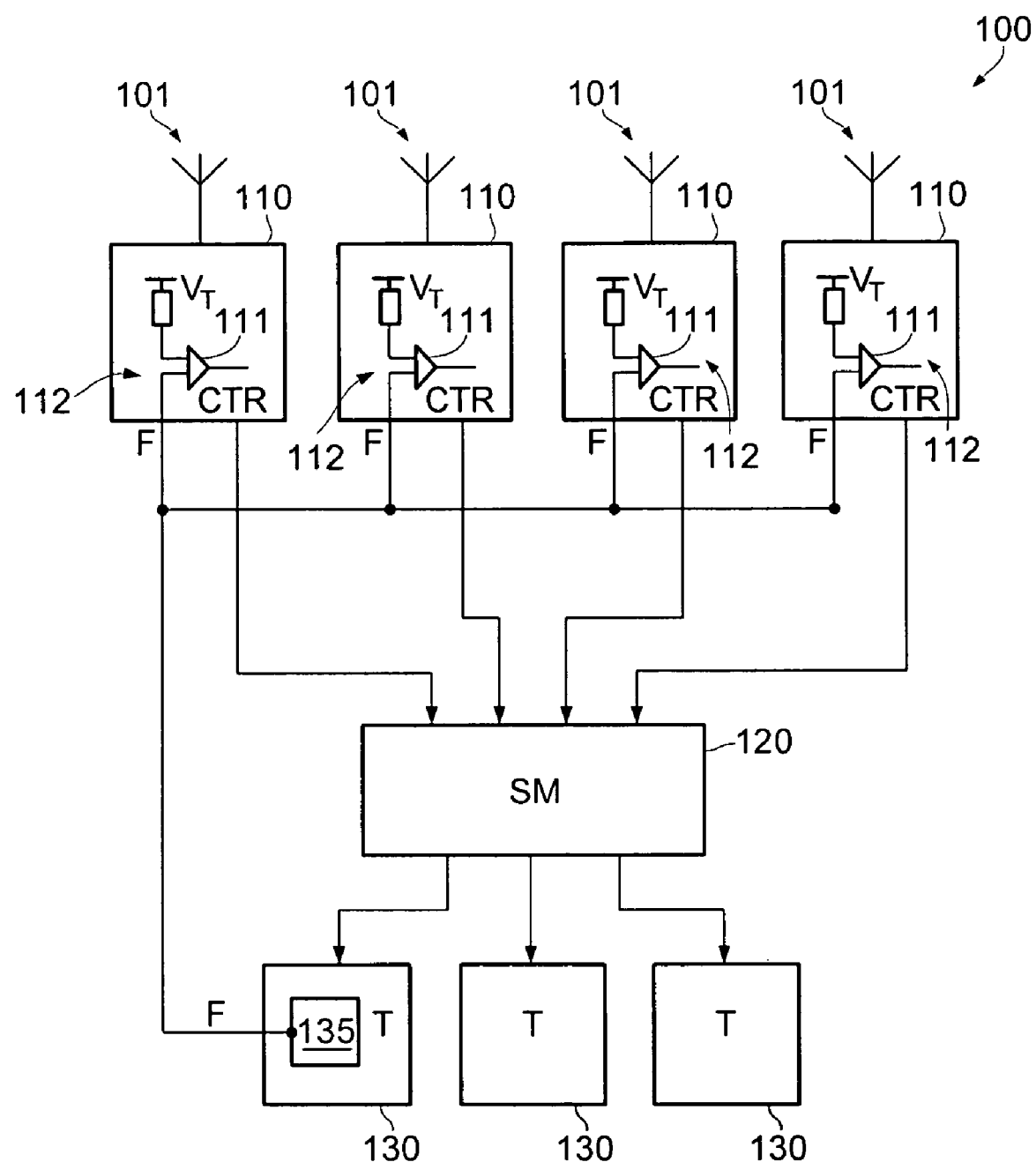
FIG. 1 is a block diagram of a mobile broadcast receiver having multiple signal amplifier systems.
Figure 2:
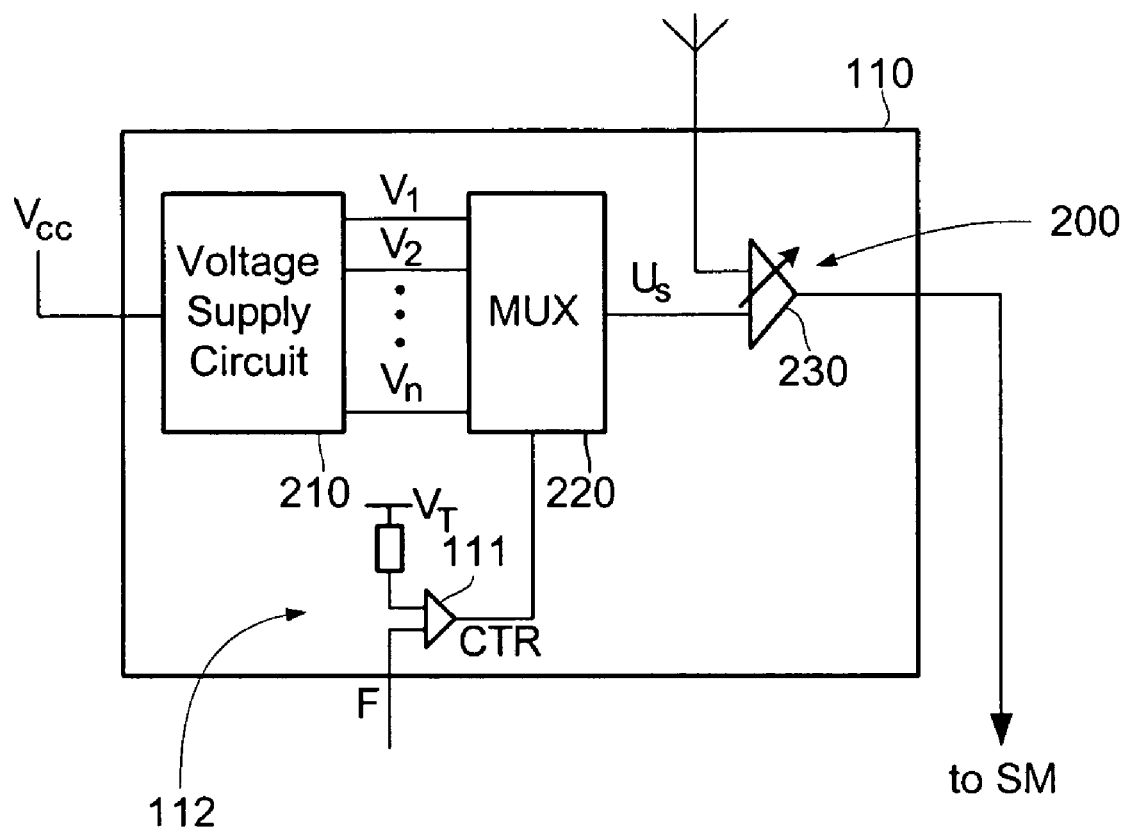
FIG. 2 is a block diagram of a first signal amplifier system.

Referring to FIGS. 1-2, a signal amplifier system 110 for a broadcast receiver 100 is described. The signal amplifier system 110 may be integrated with a broadcast receiver or located separately from the receiver. FIG. 1 shows a broadcast receiver 100 having a plurality of antennas 101 capable of receiving analog and/or digital radio and/or television signals. Other types of signals also could be received such as control signals and signals for computers and compact disc players. The signals may be transmitted by radio and/or television broadcast stations, cellular towers, and in other ways such as by satellite.

Typically, four antennas are used, but more or less antennas are possible. Antennas 101 may be connected to the signal amplifier system 110, which may amplify a broadcast signal received by the antennas 101 and apply an output signal to a switching matrix 120. The signal amplifier system 110 may be integral with the broadcast receiver and/or separate from it. Through the switching matrix 120, the received broadcast signals may be provided to tuner units 130. FIG. 1 shows three tuner units 130, but more or less tuner units may be provided. One of the tuners may serve as an analog radio tuner, while another tuner unit may be configured to receive digital radio signals, e.g. DAB-T signals. The tuner unit 130 will be described in more detail in connection with FIG. 6.

FIG. 2 shows the signal amplifier system 110 including a comparing circuit 112 having a comparator 111. FIGS. 1-2 show one comparator 111 per signal amplifier system 110 but alternatively or additionally, more comparators are possible. The field strength F of the received signal transmitted from the tuner unit 130 may be compared with at least one pre-stored threshold value. The comparator 111 may compare the signal F representing the received field strength with one threshold value $V_T$. A supply voltage control signal may be generated based on a comparing result. In the system 110, an output of the comparator 111 may be used as a supply voltage control signal CTR and may be provided to a supply voltage control circuit. The supply voltage control circuit may include a power supply voltage $V_{cc}$, a voltage supply circuit 210 and a selector 220. The comparing operation may allow an implementation to obtain the supply voltage control signal CTR based on the field strength of the received signal.

FIG. 2 further illustrates an operational circuitry 200 of the signal amplifier system 110. The operational circuitry 200 may include a variable amplifier or other circuitry such as a transistor. The signal amplifier system 10 may receive the power supply voltage $V_{cc}$ from a power supply network, such as the main power supply of a portable device or vehicle. The power supply voltage $V_{cc}$ may be 12 volts, but other values are possible. The power supply voltage $V_{cc}$ may be supplied to a voltage supply circuit 210, which may provide a plurality of different supply voltages $V_1 \ldots V_n$. Voltages $V_1 \ldots V_n$ range, for instance, from 2 to 12 volts. The plurality of different supply voltages may be supplied to a selector 220 such as a multiplexer (MUX). The selector (MUX) 220 also may receive a control signal CTR generated in the comparator 111. In response to the control signal CTR, the selector (MUX) 220 may select one of the supply voltages $V_1 \ldots V_n$. A selected supply voltage may be provided as a supply voltage $U_S$ to a variable gain amplifier 230. For instance, $U_S$ may be 5 or 8 volts depending on the applied control signal CTR.

The variable gain amplifier 230 may apply gain to an antenna signal received from antenna 101. The gain applied by variable gain amplifier 230 may be controlled in a feedback control loop fashion. Field strength signal F can fed back to the comparator 111 which controls the selector (MUX) 220. Adjusting the supply voltage results in a change of the operating point of a high frequency of any amplifying transistors included in the variable gain amplifier 230. Since the supply voltage for the variable gain amplifier 230 may be varied in accordance with the field of strength of the received signal, an optimal operational characteristic of the amplifying transistors may be attained, and power and heat emissions may be reduced.

The supply voltage applied to the operational circuitry 200 may be lowered if the field strength of the received signal is repeatedly lower than a pre-stored threshold, e.g., lower more than m times as a result of several comparisons between the field strength and the threshold. In other implementations, the supply voltage is lowered upon a single occurrence of the field strength being lower than the threshold. The value for m may be preset and stored based on a particular implementation. Several measurement and comparison cycles may be used before a switching operation occurs to help minimize the effects of temporary spikes or dips in the measured field strength of the received broadcast signal. Accordingly, unnecessary and repetitive switching operations may be avoided.

The combined field strengths of a plurality of signals obtained through several antennas may be used for generating a supply voltage control signal. This may be suitable for a situation where an antenna is adjusted to receive a relatively weak broadcast signal but a strong broadcast signal from another station may be received at the same or different antenna. In such a situation, intermodulation distortions may occur. The field strengths of the plurality of signals may be combined to minimize the effect of the strong broadcast signal on the amplifier system.

Figure 3:
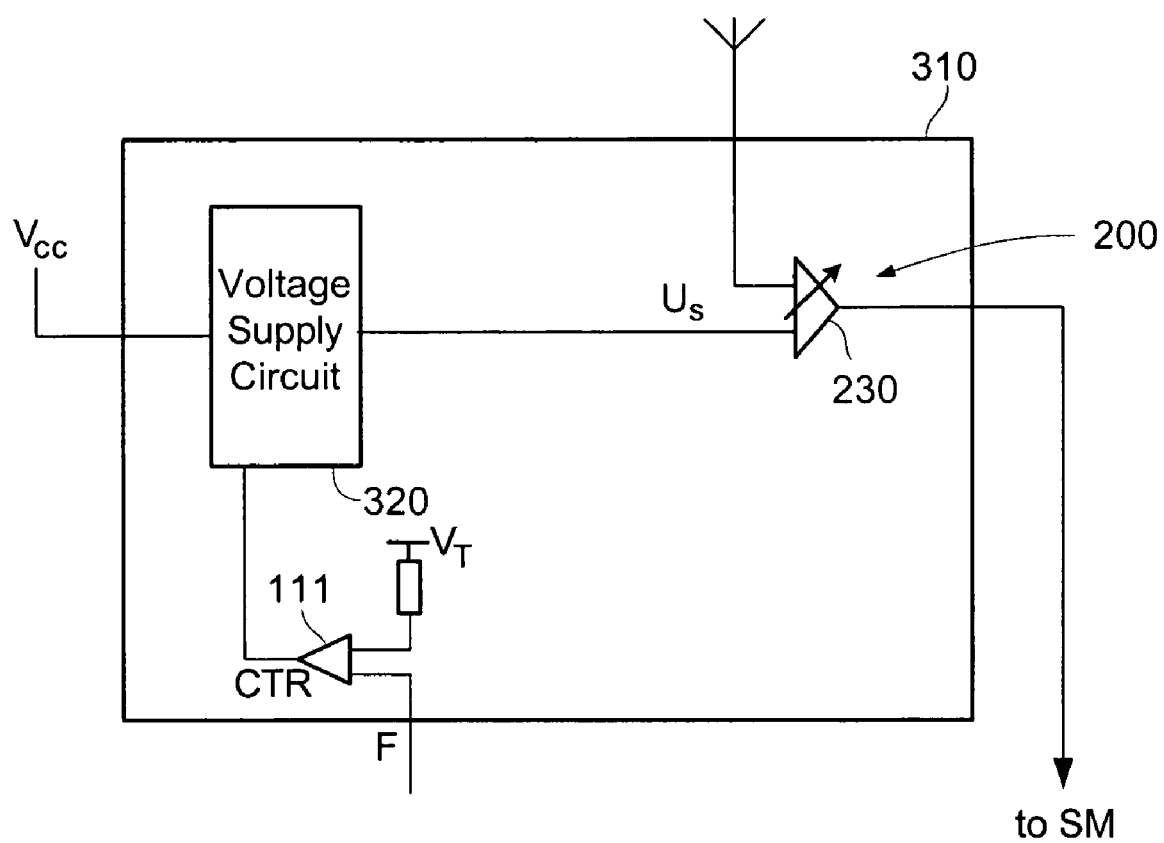
FIG. 3 is a block diagram of a second signal amplifier system.

FIG. 3 illustrates a second signal amplifier system 310. The signal amplifier system 310 may includes the operational circuitry 200 including the variable amplifier 230 as described in connection with FIG. 2. Unlike the signal amplifier system 110, the signal amplifier system 310 does not include a selector such as the selector (MUX) 220. The signal amplifier system 310 includes a voltage supply circuit 320 receiving a control signal CTR from the comparator 111. The signal amplifier system 310 may realize a different supply voltage by either changing the main power supply voltage $V_{cc}$ or changing a ratio of voltage dividers of the voltage supply circuit 320 in accordance with the control signal CTR. The signal amplifier system 310 may be simpler to implement and reduce manufacturing costs by eliminating the selector (MUX) 220.

Figure 4:
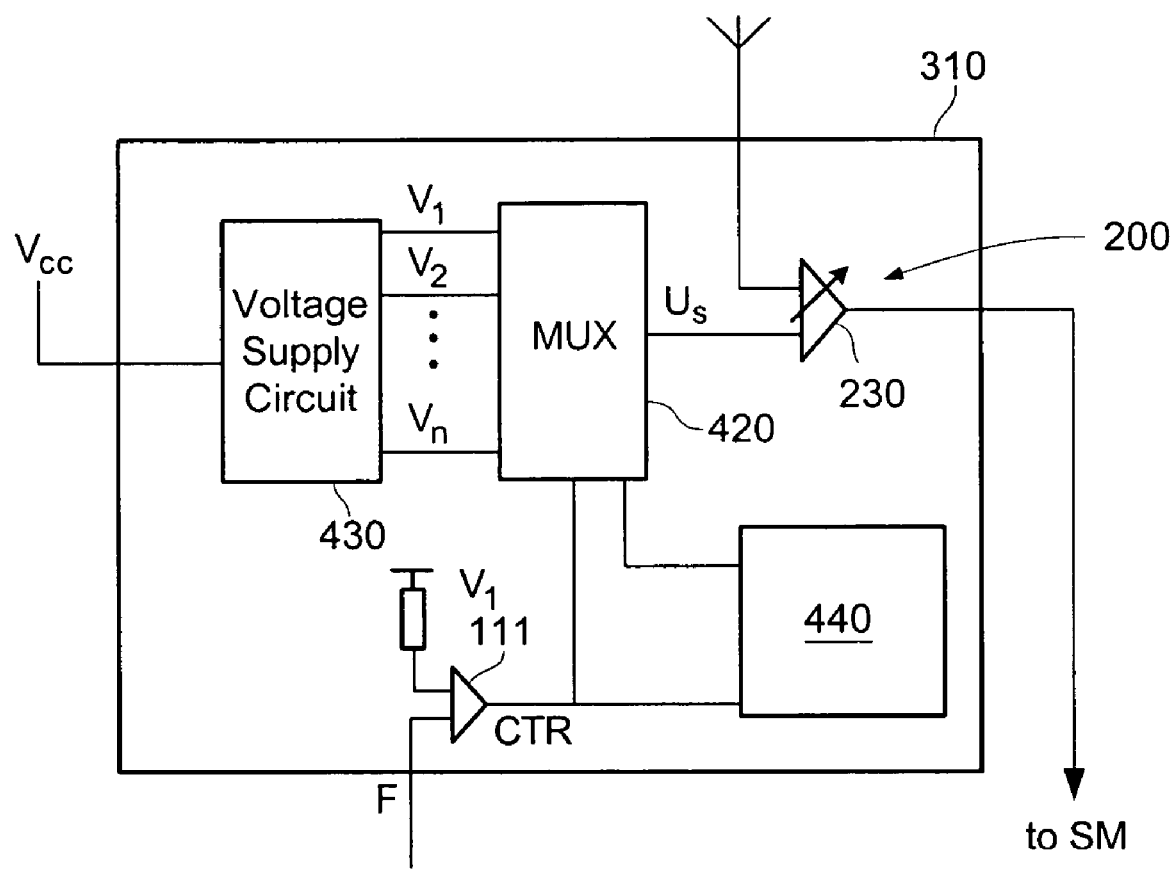
FIG. 4 is a block diagram of a third signal amplifier system.

FIG. 4 illustrates a third signal amplifier system 410. The signal amplifier system 410 may have structures similar to those of the signal amplifier system 110 shown in FIG. 2. The signal amplifier system 410 includes a counter unit 440 that is coupled to a selector 420. The counter unit 440 may include a counter and a controller that drives the counter. The comparator 111 compares the field strength F and the threshold voltage VT. The control signal CTR may be inputted to the selector (MUX) 420 and the counter unit 440. The control signal CTR indicates the comparing result, i.e., the field strength F is lower or higher than the threshold voltage $V_T$. In accordance with the control signal CTR, the counter unit 440 increments a count value n of the counter. When the count value n is incremented, the counter unit 440 may determine whether n is equal to m. Threshold count m may be preset and stored in the counter. Alternatively or additionally, the count value may be decremented. Upon determining that n is equal to m, the counter unit 440 outputs a signal to the selector (MUX) 420 to indicate that switching of a supply voltage should be made. This may prevent the selector (MUX) 420 from switching a supply voltage based on inaccurate and/or unrepresentative measurements or comparisons of the field strength and the threshold voltage $V_T$.

Figure 5:
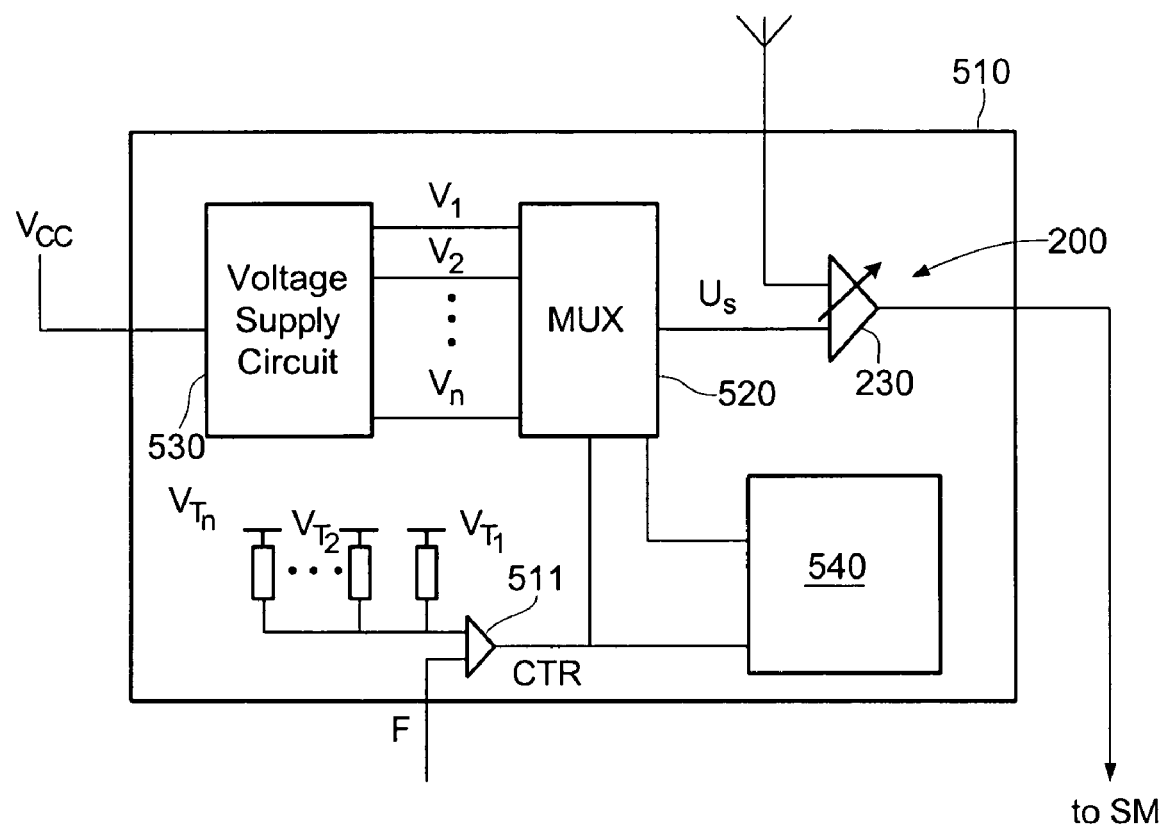
FIG. 5 is a block diagram of a fourth signal amplifier system.

FIG. 5 illustrates a fourth signal amplifier system 510. The signal amplifier system 510 includes a voltage supply circuit 530, a selector (MUX) 520 and the operational circuitry 200 including the variable amplifier 230 and a counter unit 540. A comparator 511 compares signal F with a plurality of threshold values $V_{T1}, V_{T2} \ldots V_{Tn}$. This may make obtaining finer measurement results possible. Alternatively or additionally, a plurality of comparators 511 may be used to compare the field strength F with one or a plurality of threshold voltages.

Figure 6:
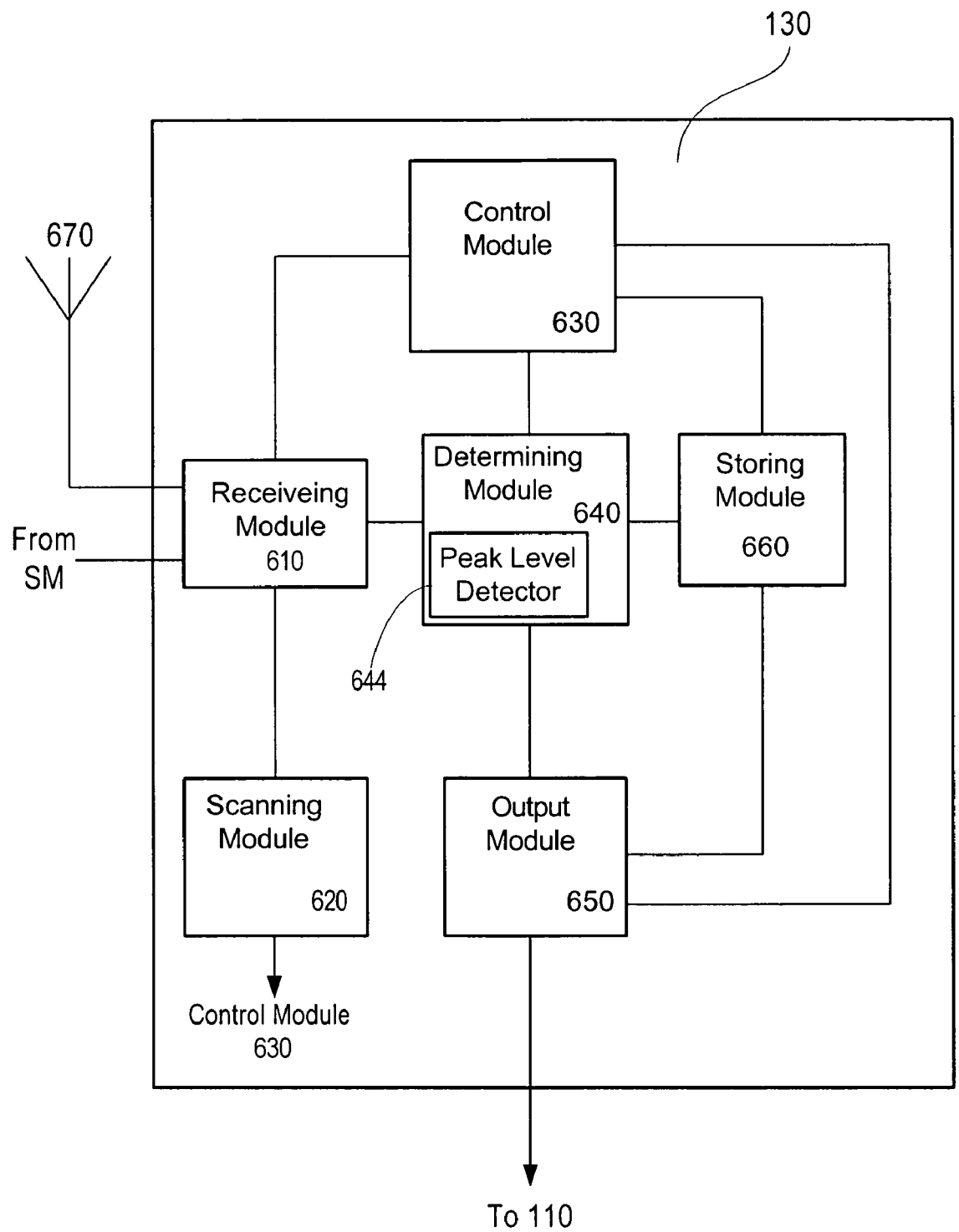
FIG. 6 is a block diagram of a tuner unit.

FIG. 6 shows an example of the tuner unit 130. The tuner unit 130 may receive analog or digital television signals through an antenna 670. The received signals may be transmitted to a receiving module 610. The tuner unit 130 may serve as a background tuner to scan a frequency spectrum for available broadcast stations. The tuner unit 130 may include a scanning module 620 for scanning a frequency spectrum. The tuner unit 130 may include a determining module 640 to determine a field strength of the received analog or digital radio signals. The determining module 640 may include a peak level detector 644. As a result of a peak level detection, the field strength may be represented as a field strength signal F. The tuner unit 130 may include a storing module 660 for storing the field strengths of the received signals. The field strength signal F may be outputted to the signal amplifier system 110 via an output module 650. A control module 630 may drive operations of modules 610, 620, 640, 650 and 660 included in the tuner unit 130. The control module 630 updates the stored field strengths of the received signals.

Figure 7:
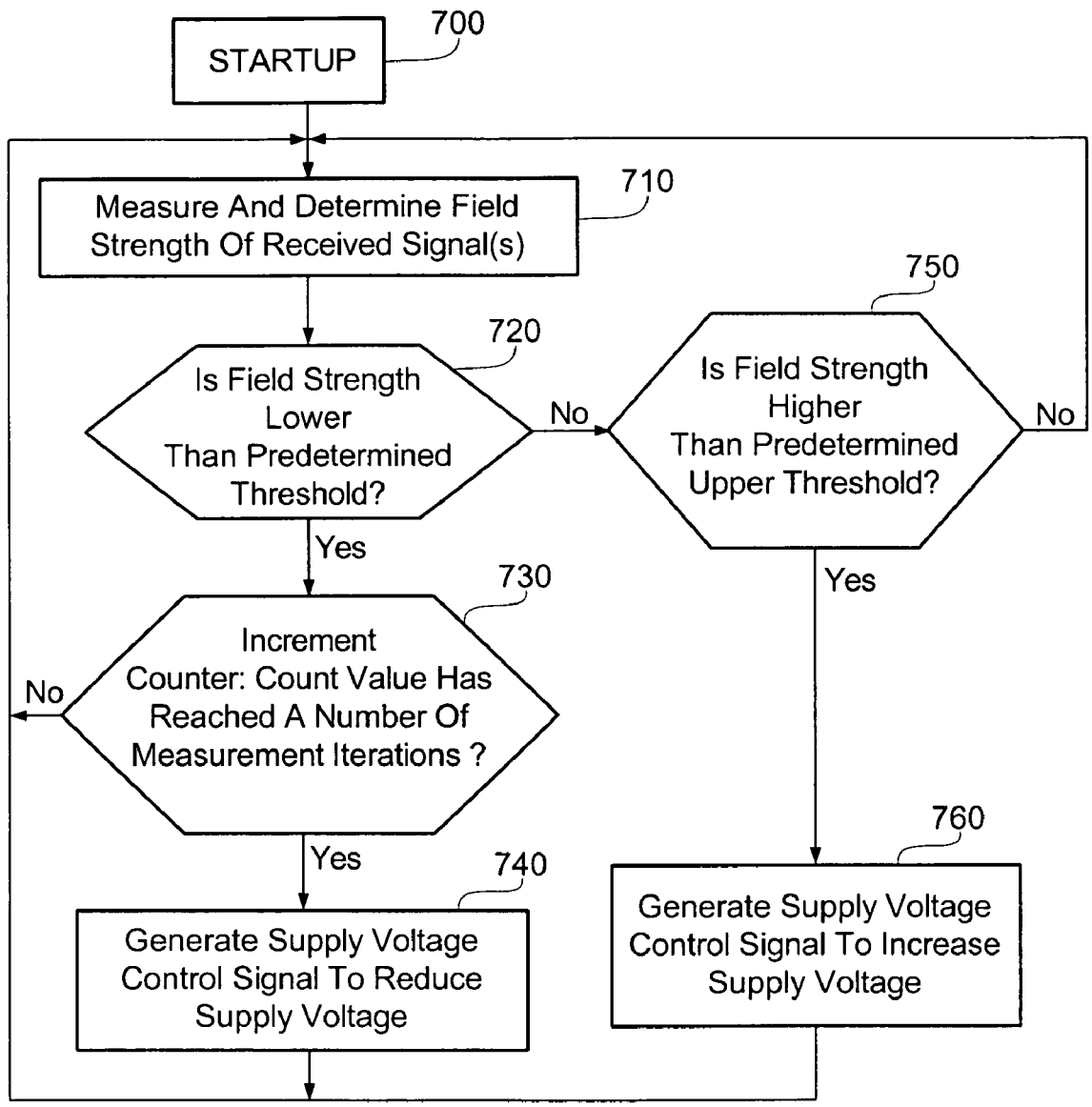
FIG. 7 is a flowchart illustrating a first operation of a signal amplifier system.

FIG. 7 is a flowchart illustrating an operation of a signal amplifier system such as signal amplifier systems 110, 310, 410 and 510. The flowchart illustrates a control algorithm that may be for a power saving operation of the signal amplifier system such as the signal amplifier systems 110, 310, 410 and 510 and a broadcast receiver such as the broadcast receiver 100. For convenience of discussion, the signal amplifier system 110 and the broadcast receiver 100 are used as an example in connection with FIG. 7. Upon STARTUP (block 700), such as by switching on the broadcast receiver 100, a supply voltage may be provided to the operational circuitry 200 of the signal amplifier system 110. Upon turning on the signal amplifier system 110, the highest supply voltage may be applied to the operational circuitry 200 of the signal amplifier system 110 as a default value. Alternatively, the lowest value may be provided upon the startup. At block 710, the field strength of the received broadcast signal or the combined broadcast signals may be measured and determined. At block 720, the comparator 111 compares the field strength signal with a determined threshold of the field strength. The threshold field strength may be implementation dependent. If the measured field strength signal is lower than the threshold, a count value n may be incremented at block 730. The count value n indicates the number of times the measured field strength is lower than the threshold. Other procedures may be used to track the number of measurements such as decrementing a counter.

If the field strength of the received signal is repeatedly lower than the threshold, e.g., at least m times, the operation proceeds to block 740. The value for m may be preset and stored. The value for m indicates the number of measurement iterations. The comparing operation may be repeated to determine whether the field strength indicates the same measurement after several measurement cycles. The count value n may be incremented and/or decremented to track the number of times that the comparing operation has occurred. When the count value n reaches m, a supply voltage control signal may be generated at block 740. Performing the iterations before generating the supply voltage control signal may help ensure that the supply voltage control signal is generated based on accurately measured field strengths rather than erroneously measured field strengths. The counter value n may be reset after the value reaches m and/or after a preset amount of time has elapsed.

At block 740, a supply voltage control signal may be generated in response to the low field strength, which may be supplied to the selector (MUX) 220. Based on the supply voltage control signal, the selector (MUX) 220 may select a reduced supply voltage, which may be provided to the variable gain amplifier 230. A reduction in the supply voltage may continue such as in steps, until an allowable minimum voltage is reached.

When the comparison result at block 720 indicates that the field strength of the received signal is not lower than the predetermined threshold, it is further determined at block 750 whether the field strength of the received signal is higher than an upper threshold. If the field strength of the received signal is higher than the upper threshold, a supply voltage control signal may be generated in response to the high field strength at block 760, which may be provided to the selector (MUX) 220. The selector (MUX) 220 selects an increased supply voltage, which may be provided to the variable gain amplifier 230 as the voltage $U_s$. Further, at block 760, the increase of the supply voltage may be made step by step until an allowable maximum voltage is reached. Significant power savings and reduced heat dissipation may be obtained by controlling the supply voltage in such a way.

Figure 8:
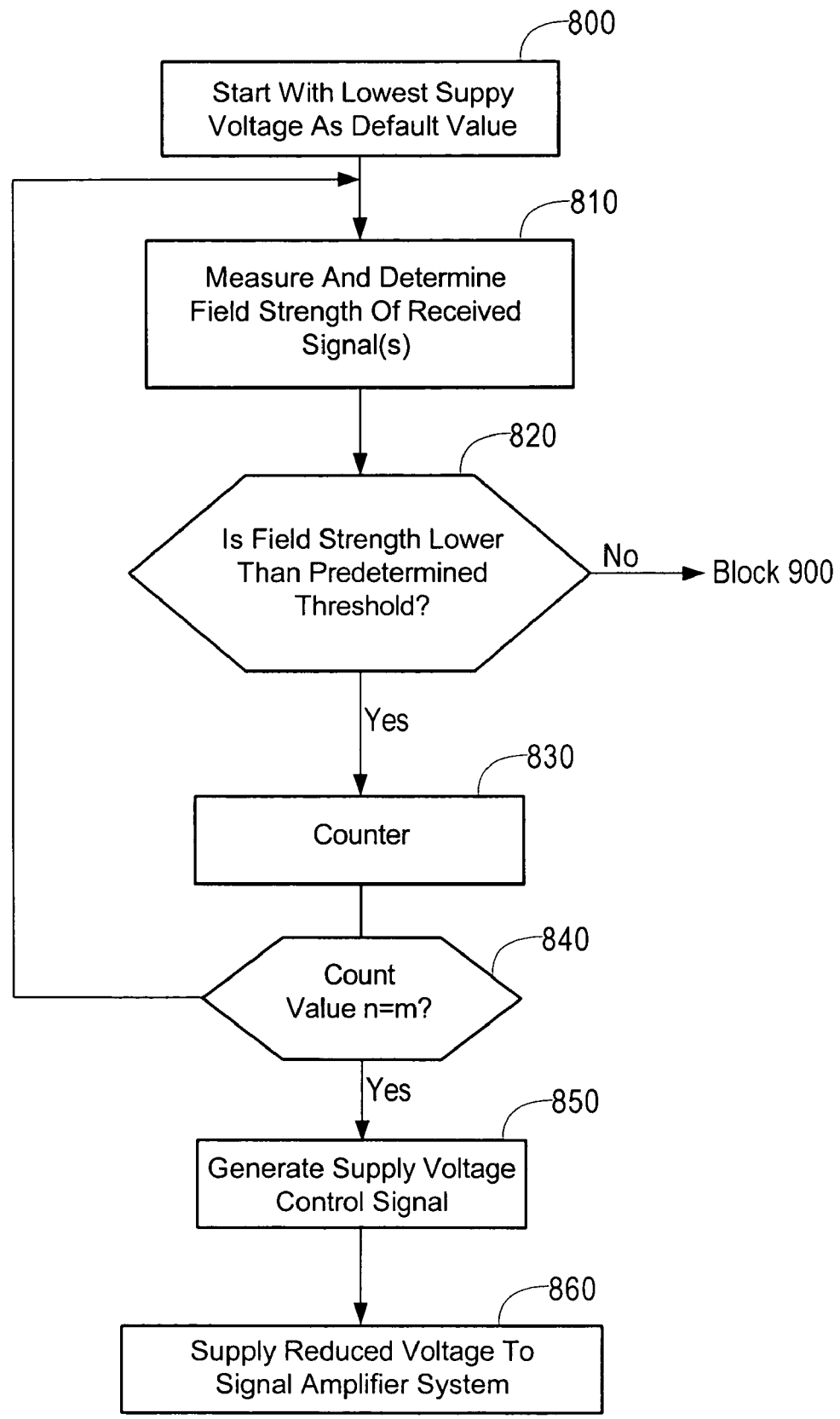
FIG. 8 is a flowchart illustrating a second operation of a signal amplifier system.
Figure 9:
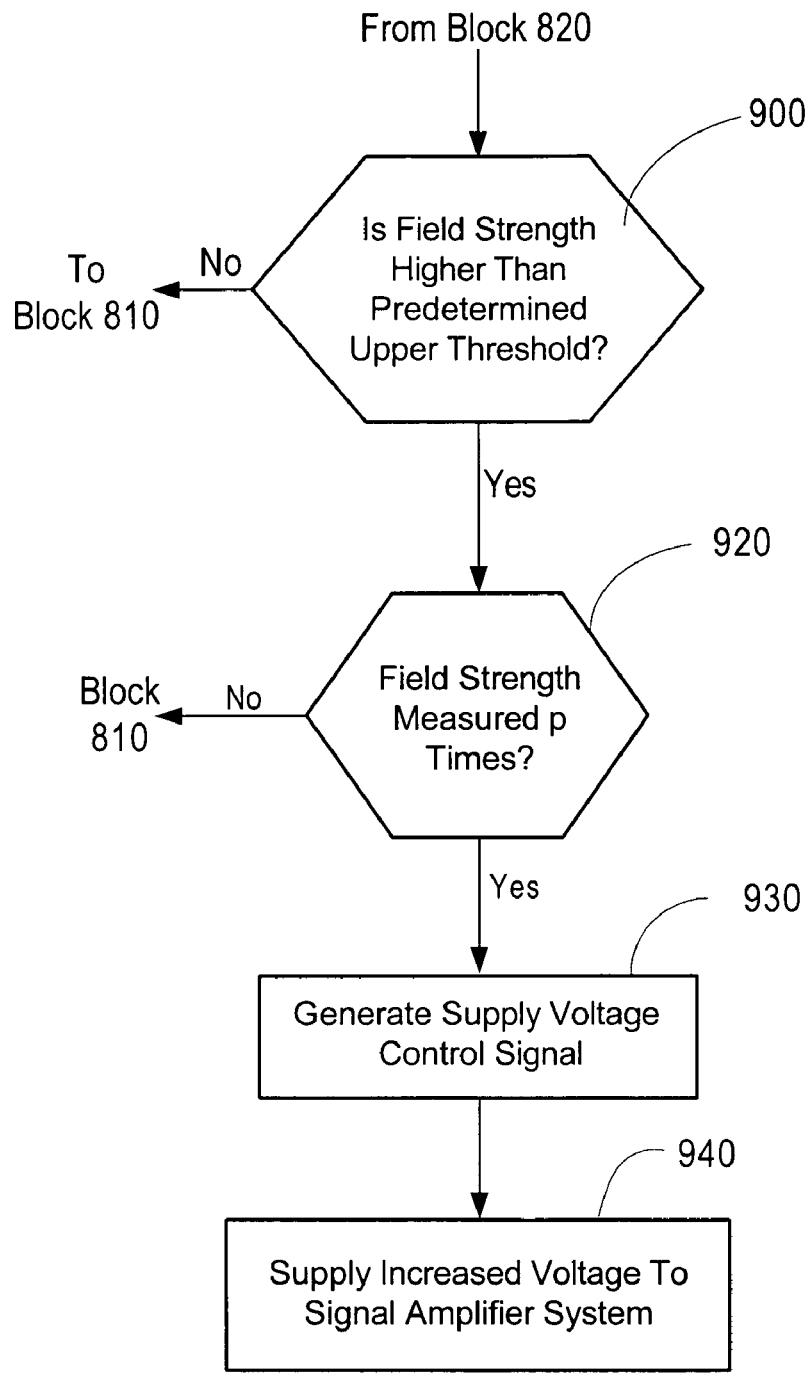
FIG. 9 is a continuation of the flowchart in FIG. 8.

FIGS. 8-9 illustrate an operation of a signal amplifier system. The signal amplifier system may include the signal amplifier system 110, 310, 410 and 510. Upon START of the signal amplifier system, a lowest supply voltage may be supplied to the operational circuit as a default value (block 800). At block 810, a field strength of received signal may be measured and determined. Subsequently, the field strength of the received signal may be compared with a predetermined threshold at block 820. If the field strength is lower than the threshold, the counter is incremented at block 830. Alternatively, the counter can be decremented. A count threshold value m may be preset and stored. The count value n may be compared with the count threshold value m at block 840. The count threshold value m indicates how many times the same comparing result occurs. If the field strength is repeatedly lower than the threshold value at least m times, that may be an accurate indication of a low field strength. As a result of the comparing results, at block 850 a supply voltage control signal may be generated and a reduced voltage may be supplied to the operational circuitry of the signal amplifier system (at block 860).

In FIG. 9, if the field strength is not lower than the predetermined threshold, it is compared with an upper threshold value at block 900. If the field strength is determined to be not higher than the upper threshold, it may be measured and determined again at block 810. At block 920 it is determined if the field strength has been measured p times. The value p may be the same as or different than m. The number of times the field has been measured may be determined using a counter. If the number of measurements has not reached p, the field strength may be measured again at block 810. If the count value of p is reached, at block 930, a supply voltage control signal may be generated and an increased voltage may be supplied to the operational circuitry of the signal amplifier system.

Figure 10:
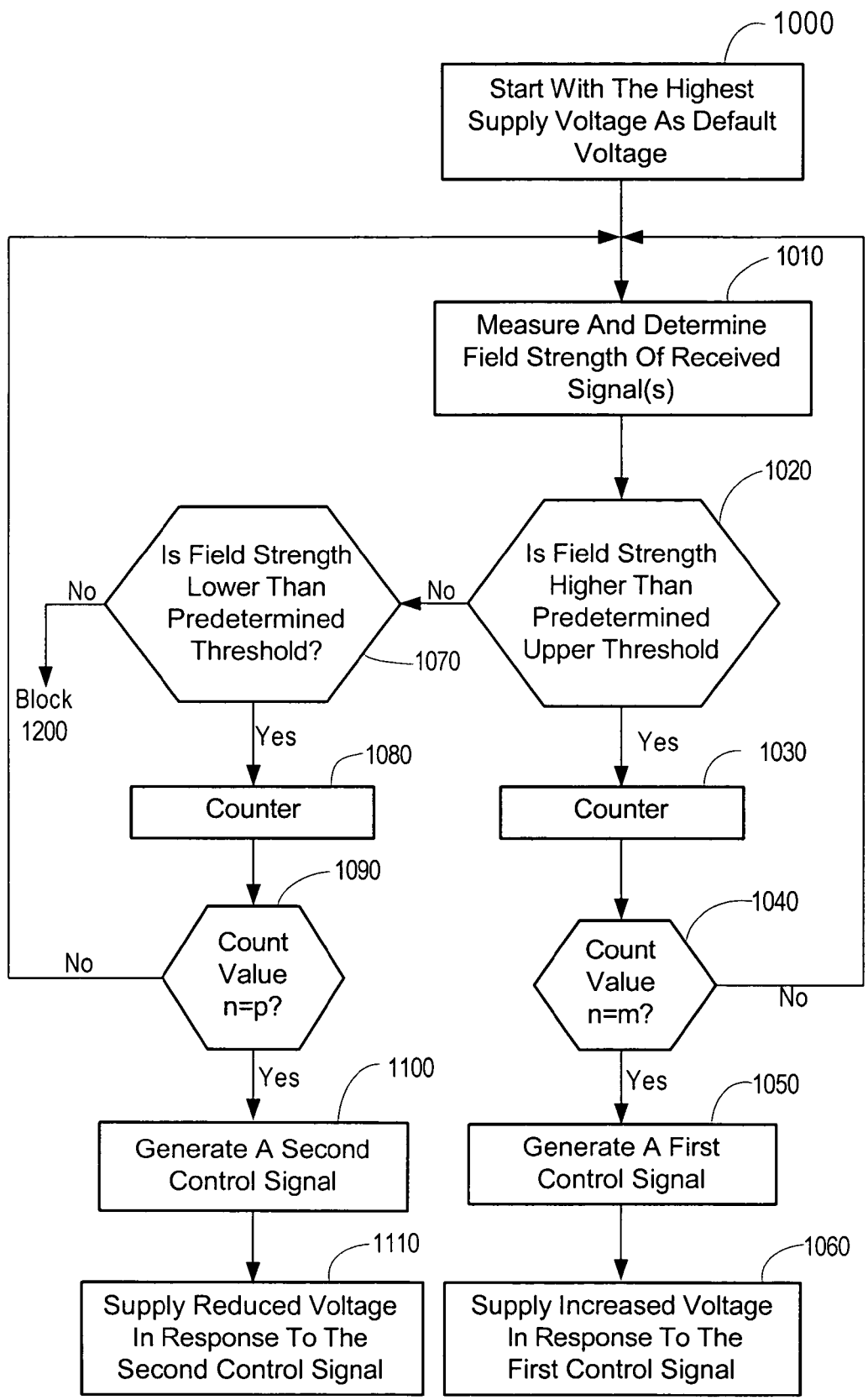
FIG. 10 is a flowchart illustrating a third operation of a signal amplifier system.
Figure 11:
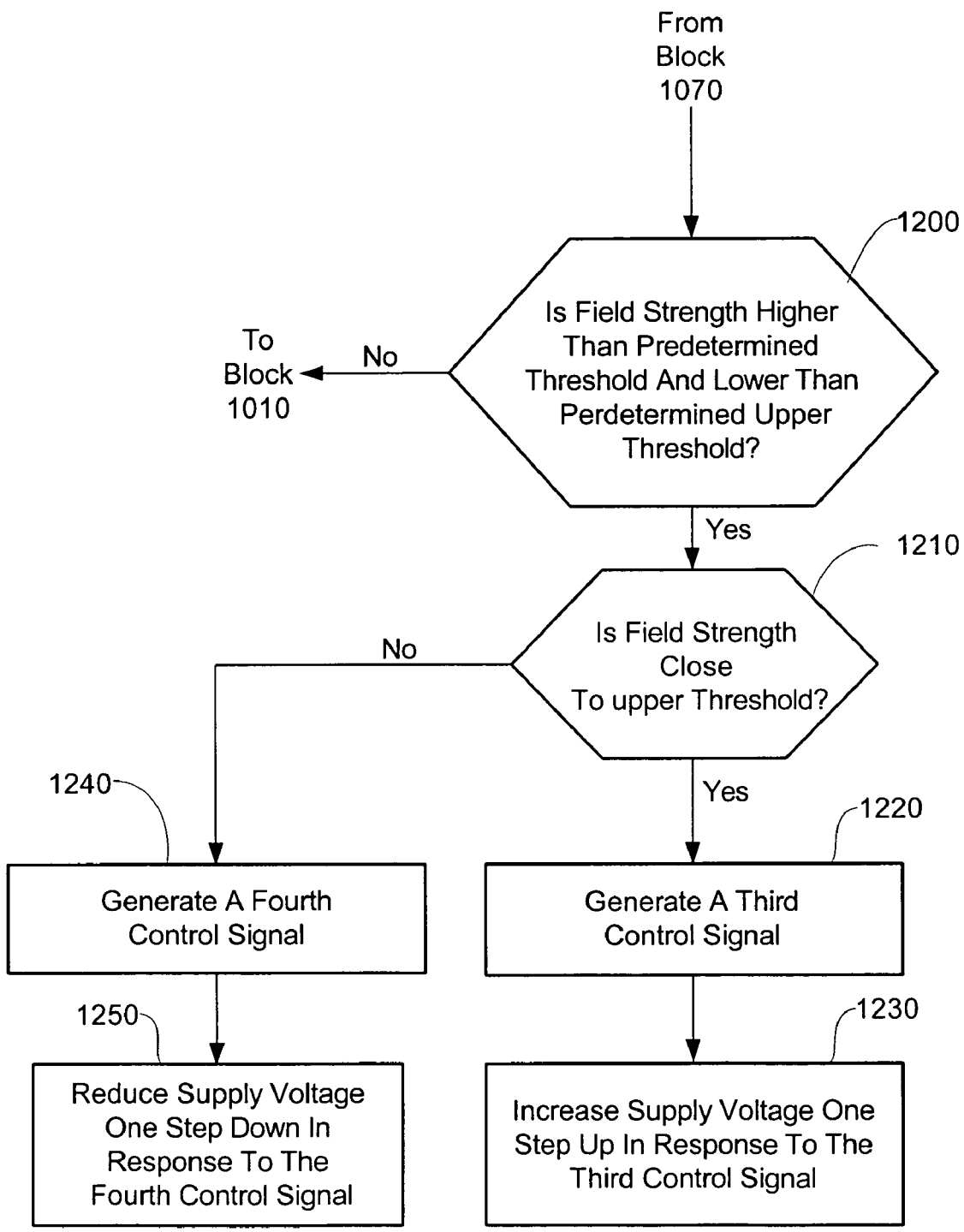
FIG. 11 is a continuation of the flowchart in FIG. 10.

FIGS. 10 and 11 are flowcharts illustrating another operation of a signal amplifier system. The signal amplifier system may include the signal amplifier system, 110, 310, 410 and 510. The highest supply voltage may be supplied as a default voltage at block 1000 such as upon startup of the signal amplifier system. Alternatively, the lowest supply voltage may be used as a default voltage. The field strength of a signal may be measured and determined at block 1010. The field strength may be compared with a predetermined upper strength at block 1020. If the comparing result shows that the field strength is higher than the upper threshold, a count value n may be incremented at block 1030. Then, at block 1040 a determination is made regarding whether n is equal to a count threshold value m. If the count value n is equal to m, then a first control signal may be generated at block 1050. Because the field strength is stronger than the upper threshold, an increased voltage may be generated in response to the first control signal at block 1060.

If the field strength is not higher than the upper threshold, it is compared with another threshold, e.g., a lower threshold at block 1070. If the field strength is lower than the lower threshold, the counter may be incremented at block 1080. Alternatively, the counter may be decremented depending on an implementation. At block 1090, the count value n is determined to reach p. The value p may be the same or different from m. If the count value equals p, then the field strength may be determined to be lower than the lower threshold. A second control signal may be generated based on the comparing result at block 1100 and a reduced voltage may be generated in response to the second control signal at block 1110. If the count value n is not equal to the count threshold value m or p at the blocks 1040 and 1090, the field strength may be measured again at block 1010.

In FIG. 11, it is determined whether the field strength is between the lower threshold and the upper threshold at block 1200. If the field strength does not have such an intermediate value, the field strength will be measured again at block 1010. If the field strength has the intermediate value between the lower and upper thresholds, it is determined whether the field strength may be close to the upper threshold at block 1210. If the field strength may be close to the upper threshold, a third control signal may be generated at block 1220. In response to the third control signal, a supply voltage may be increased by a step at block 1230. The step increase is less than the full voltage available. If the field strength is not close to the upper threshold, a fourth control signal may be generated at block 1240. In response to the fourth control signal, a supply voltage may be reduced by a step at block 1250. Alternatively, it may be determined whether the field strength is lower than a center threshold value. The center threshold value may be a center value of the lower threshold and the upper threshold value. If the field strength is lower than the center threshold value, a supply voltage may be further reduced. By using various threshold values, it is possible to obtain a fine control of an increase or reduction in a supply voltage. Such fine adjustment of a supply voltage may optimize power saving operations of a signal amplifier system.

Alternate and additional implementations may be used. For example, an increased supply voltage may be supplied for a field strength lower than the determined threshold and a decreased supply voltage may be supplied for a field strength higher than the determined threshold. Moreover, the amplifiers may be implemented with other solid state and/or tube technologies.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A signal amplifier system for a mobile broadcast receiver comprising:

an operational circuitry coupled to an antenna for receiving an incoming broadcast signal from the antenna and applying a variable gain to the incoming broadcast signal and outputting a resultant broadcast signal;

a tuner which receives the resultant broadcast signal and determines a field strength of the resultant broadcast signal;

a comparator which receives a field strength signal representative of the field strength of the resultant broadcast signal from the tuner and compares the field strength signal with one or more threshold values and generates a supply voltage control signal; and a supply voltage control circuit which generates a plurality of different supply voltages and outputs a selected supply voltage of the plurality of supply voltages to the operational circuitry based on the supply voltage control signal;

where the selected supply voltage is provided as a power supply voltage to the operational circuitry and changes an operational characteristic of the operational circuitry;

where the selected supply voltage is proportional to the field strength of the resultant broadcast signal and the selected supply voltage applied to the operational circuitry is lowered if the field strength of the received incoming broadcast signal is lower than a selected threshold.

2. The signal amplifier system according to claim 1, further comprising a switching matrix to supply the resultant broadcast signal to the tuner.

3. The signal amplifier system according to claim 1, where the tuner comprises a level detector to detect a peak level of a carrier frequency in a television signal.

4. The signal amplifier system according to claim 1, where the selected supply voltage comprises one of a first supply voltage and a second supply voltage and when the field strength signal exceeds an upper threshold, a higher one of the first supply voltage and the second supply voltage is applied to the operational circuitry.

5. The signal amplifier system according to claim 4, where the higher one of the first supply voltage and the second supply voltage is applied to the operational circuitry as a default value.

6. The signal amplifier system according to claim 1, further comprising a counter operable to count a number of comparisons by the comparator where the counter is operable to determine that the field strength signal is an accurate measurement.

7. The signal amplifier system according to claim 6, where when the field strength signal is lower than a lower threshold at least m times, a lower one of the first supply voltage and the second supply voltage is applied to the operational circuitry.

8. The signal amplifier system according to claim 7, where the value for m is preset and stored.

9. The signal amplifier system according to claim 1, where the supply voltage control circuit comprises a multiplexer which selectively outputs the selected supply voltage in response to the supply voltage control signal.

10. A signal amplifier system for a mobile or portable broadcast receiver, comprising:

an operational circuitry which receives an incoming broadcast signal and outputs a resultant broadcast signal by amplifying the incoming broadcast signal;

a tuner which generates a field strength signal where the field strength signal indicates combined field strengths of a plurality of broadcast signals received with a plurality of antennas;

a comparator which generates a supply voltage control signal by comparing the combined field strengths of the received broadcast signals with at least one determined threshold value; and means for supplying a selected supply voltage to the operational circuitry in accordance with the supply voltage control signal, the means for supplying the selected supply voltage comprising:
  a voltage supply circuit supplying a plurality of different supply voltages and
  a multiplexer selectively outputs the selected supply voltage in response to the supply voltage control signal;
where the selected supply voltage is provided as a power supply voltage to the operational circuitry and changes an operational characteristic of the operational circuitry;
where the selected supply voltage is proportional to the field strength and the selected supply voltage applied to the operational circuitry is lowered if the field strength of the received incoming broadcast signal is lower than a selected threshold.

11. The signal amplifier system according to claim 10, where upon switching on of the signal amplifier system, a highest supply voltage is applied to the operation circuitry as a default value.

12. The signal amplifier system according to claim 10, where the selected supply voltage comprises one of a first supply voltage and a second supply voltage and when the field strength signal exceeds an upper threshold, a higher one of the first supply voltage and the second supply voltage is applied to the operational circuitry.

13. The signal amplifier system according to claim 12, where the higher one of the first supply voltage and the second supply voltage is applied to the operational circuitry.

14. The signal amplifier system according to claim 10, where the selected supply voltage comprises one of a first supply voltage and a second supply voltage and when the field strength signal is lower than a lower threshold at least m times, a lower one of the first supply voltage and the second supply voltage is applied to the operational circuitry.

15. The signal amplifier system according to claim 14, where the value for m is preset and stored.

16. The signal amplifier system according to claim 10, where the plurality of broadcast signals comprises a first signal and a second signal, the first signal and the second signal configured to have two different field strengths and being received at a single antenna, or two different antennas.

17. The signal amplifier system according to claim 10, where the operational circuitry comprises at least one amplifying transistor and the selected supply voltage changes an operating point of a high frequency of the at least one amplifying transistor.

18. The signal amplifier system according to claim 10, where the operational circuitry comprises a variable gain amplifier.

19. The signal amplifier system according to claim 10, where the means for supplying the selected supply voltage comprises means for dividing a main power supply voltage by a different divider factor in response to the supply voltage control signal.

20. A method for controlling a supply voltage to a signal amplifier system for a broadcast receiver, comprising:
  receiving an incoming broadcast signal from an antenna and applying a variable gain to the incoming broadcast signal to generate a resultant broadcast signal;
  generating a field strength signal of the resultant broadcast signal;
  receiving the field strength signal, where the field strength signal indicates a field strength of at least one broadcast signal;
  comparing the field strength signal with a plurality of threshold values;
  generating a supply voltage control signal based on a comparing result;
  generating and supplying a selected supply voltage in accordance with the supply voltage control signal;
  supplying the selected supply voltage to an operational circuitry;
  where the selected supply voltage is provided as a power supply voltage to the operational circuitry and changes an operational characteristic of the operational circuitry;
  where the selected supply voltage to the operational circuitry is proportional to the field strength of the at least one broadcast signal; and,
  lowering the selected supply voltage applied to the operational circuitry if the field strength of the received incoming broadcast signal is lower than a selected threshold.

21. The method according to claim 20, where the step of comparing the field strength signal comprises comparing the field strength with an upper threshold value and a lower threshold value.

22. The method according to claim 21, where the step of comparing the field strength signal comprises comparing the field strength with an intermediate value.

23. The method according to claim 21, further comprising increasing the supply voltage based on a comparing result between the field strength and the upper threshold value.

24. The method according to claim 21, further comprising reducing the supply voltage based on a comparing result between the field strength and the lower threshold value.

25. The method according to claim 22, further comprising increasing the supply voltage based on the comparing result between the field strength and the intermediate value.

26. The method according to claim 25, further comprising increasing the supply voltage by one step based on a comparing result between the field strength and the intermediate value.

27. The method according to claim 25, further comprising reducing the supply voltage by one step based on the comparing result between the field strength and the intermediate value.

28. The method according to claim 20, further comprising determining whether the field strength signal is an accurate measurement using a counter.

29. The method according to claim 28, wherein the step of determining comprises:
  incrementing a count value n based on the comparing result; and,
  determining that the count value n is equal to a count threshold value m.

30. The method according to claim 28, wherein the step of determining comprises:
  decrementing a count value n based on the comparing result; and,
  determining that the count value n is equal to zero.

31. The method according to claim 20, further comprising generating a switching signal.

32. The method according to claim 31, further comprising adjusting the selected supply voltage upon receipt of the switching signal.

33. A method for controlling a supply voltage to a signal amplifier system for a broadcast receiver, comprising:
  receiving a new incoming broadcast signal at an operational circuitry;
  applying a variable gain to the new incoming broadcast signal and outputting a resultant broadcast signal;

generating a field strength signal of the resultant broadcast signal, where the field strength signal indicates combined field strengths of a plurality of broadcast signals where the plurality of broadcast signals comprises a first signal and a second signal, the first signal and the second signal configured to have two different signal strengths and where the first signal and the second signal having the two different signal strengths are received at a single antenna, or two different antennas;

generating the field strength signal comprising:
  measuring each field strength of the plurality of signals and combining the measured field strength to minimize the effect of a strong broadcast signal;

generating a supply voltage control signal based on the field strength signal;

supplying one of a first supply voltage and a second supply voltage to the operational circuitry in accordance with the supply voltage control signal; and applying to the new incoming broadcast signal a variable gain responsive to the supply voltage control signal;

where the selected supply voltage is provided as a power supply voltage to the operational circuitry and changes an operational characteristic of the operational circuitry;

where the supply voltage control signal is proportional to the field strength; and, lowering the selected supply voltage applied to the operational circuitry if the field strength of the new incoming broadcast signal is lower than a selected threshold.

34. The method according to claim 33, where the step of generating the supply voltage control signal comprises comparing the received field strength signal with at least one determined threshold value.

35. The method according to claim 34, where the step of generating the supply voltage control signal further comprises generating the supply voltage control signal based on a comparing result.

36. The method according to claim 34, further comprising supplying a higher one of the first supply voltage and the second supply voltages to the operational circuitry when the field strength signal exceeds an upper threshold.

37. The method according to claim 33, further comprising:
  upon switching on of the signal amplifier system, supplying a higher one of the first supply voltage and the second supply voltage to the operational circuitry.

38. The method according to claim 34, further comprising supplying a lower one of the first supply voltage and the second supply voltage to the operational circuitry, when the field strength signal is lower than a lower threshold at least m times.

39. The method according to claim 33, further comprising increasing or reducing the selected supply voltage in steps until the selected supply voltage reaches an allowable minimum or maximum value.

\* \* \* \* \*

UNITED STATES PATENT AND TRADEMARK OFFICE
CERTIFICATE OF CORRECTION

| | | |
|---|---|---|
| PATENT NO. | : 7,457,598 B2 | Page 1 of 1 |
| APPLICATION NO. | : 11/020430 | |
| DATED | : November 25, 2008 | |
| INVENTOR(S) | : Michael Zahm et al. | |

It is certified that error appears in the above-identified patent and that said Letters Patent is hereby corrected as shown below:

On the Title Page

Item (30), line 1, under "Foreign Application Priority Data", delete "20 2004 005 208" and substitute --20 2004 005 208.3-- in its place.

Signed and Sealed this

Sixteenth Day of June, 2009

JOHN DOLL
*Acting Director of the United States Patent and Trademark Office*